United States Patent [19]

Grancher et al.

[11] Patent Number: 5,438,020
[45] Date of Patent: Aug. 1, 1995

[54] PROCESS FOR FLIP-CHIP BONDING A SEMICONDUCTOR CHIP USING WIRE LEADS

[75] Inventors: Alain Grancher, Vemars; Ludovic Michel, Plaisir, both of France

[73] Assignee: Thomson-CSF, Paris, France

[21] Appl. No.: 121,881

[22] Filed: Sep. 17, 1993

[30] Foreign Application Priority Data

Sep. 25, 1992 [FR] France ................ 92 11447

[51] Int. Cl.6 .............. H01L 21/283; H01L 21/58; H01L 21/603
[52] U.S. Cl. .............. 437/183; 437/209; 29/850; 228/180.5
[58] Field of Search .............. 437/183, 209; 228/180.5, 904; 29/850

[56] References Cited

U.S. PATENT DOCUMENTS 3,621,565 11/1971 Sandstrom et al. .
5,014,111 5/1991 Tsuda et al. ............ 437/183
5,173,451 12/1992 Kinsman et al. ............ 437/209

FOREIGN PATENT DOCUMENTS 0435009 7/1991 European Pat. Off. .
182643 3/1989 Japan ............ 437/209
372642 3/1991 Japan ............ 228/904
WO91/00619 1/1991 WIPO .

OTHER PUBLICATIONS

IBM Technical Disclosure Bulletin, vol. 26, No. 38, Aug. 1983, New York, US, p. 1548, H. Andreas, et al., "Cooling System for Semiconductor Modules".

*Primary Examiner*—Olik Chaudhuri
*Assistant Examiner*—David E. Graybill
*Attorney, Agent, or Firm*—Oblon, Spivak, McClelland, Maier & Neustadt

[57] ABSTRACT

A flip-chip process in which the chip is positioned with its contacts facing a substrate. Small gold balls, obtained by the melting of the end of a gold wire, are soldered to the contacts of the chip and a segment of the gold wire is left attached to the ball. The mounting on the substrate is under heat, for example by means of a heating table, by positioning the chip on the substrate and by making use, for this purpose, of wire segments that are suitably arranged during an intermediate operation which consists of folding them in a predetermined way. A solder paste, deposited beforehand by means of a stencil, provides for the soldering between the balls and the facing parts of the conductors of the substrate.

3 Claims, 1 Drawing Sheet

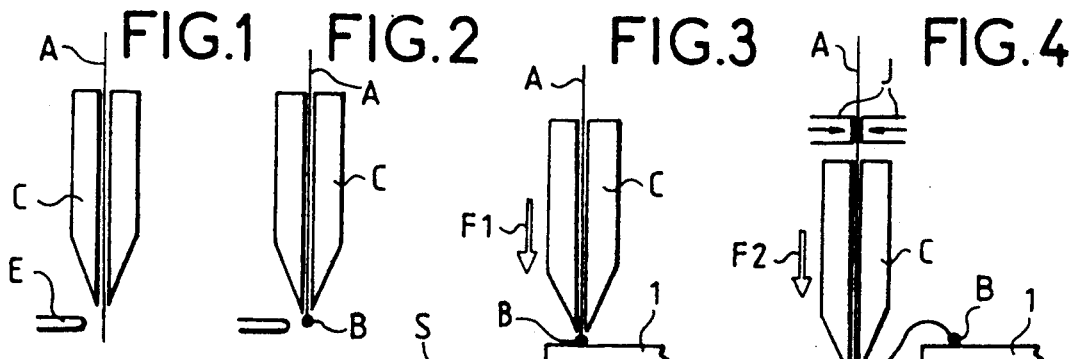
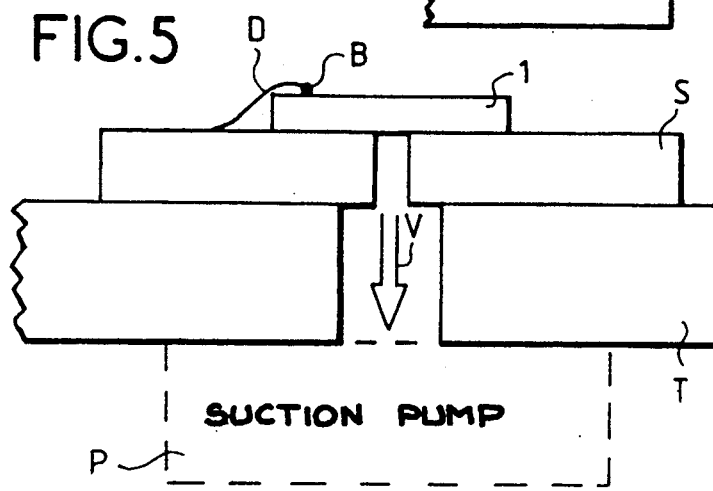
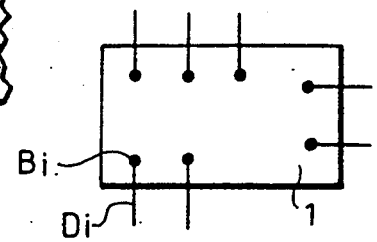
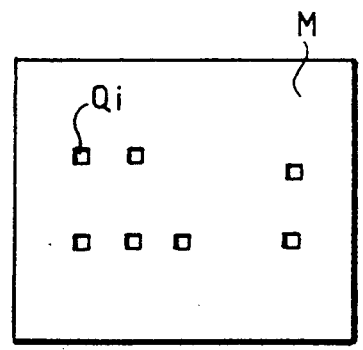
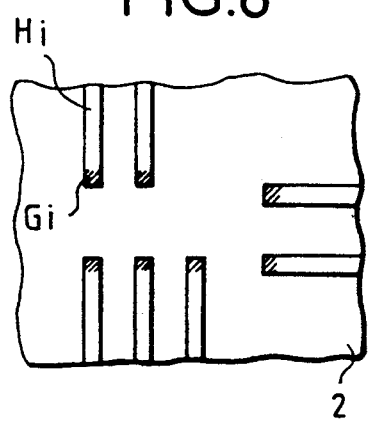
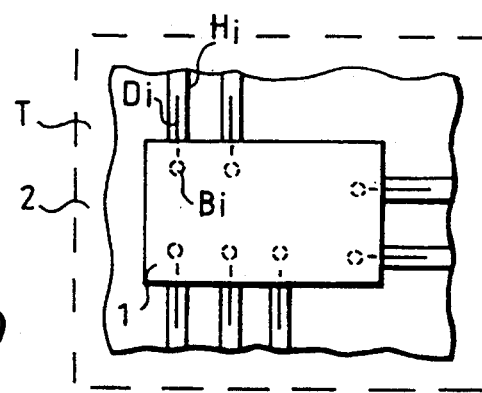

PROCESS FOR FLIP-CHIP BONDING A SEMICONDUCTOR CHIP USING WIRE LEADS

BACKGROUND OF THE INVENTION

The present invention relates to a method to enable a flip-chip type mounting of a chip on a face of a receiver substrate generally constituted by an insulator ceramic associated with conductive tracks. The flip-chip type mounting is known. It results in an assembly wherein the face of the chip containing the contacts of the chip faces the receiver substrate.

There is a known way of carrying out a flip-chip mounting by means of the technique called "ball-bonding" which consists in making electrical links by means of gold wires that have one of their ends melted, for example by means of an electrical arc, to form a small ball. In the case of a chip, this ball is then pressed to a contact of the chip to constitute a pad that is led into contact with the desired position of the receiver substrate on which the chip has to be mounted. It is thus that there is a known way, described in the PCT application No. W0-A-91-00619, of carrying out a soldering, at each contact of a chip, of a gold ball obtained by the melting of the end of a gold wire and then of breaking the wire at a certain distance from the ball. The chip then, at each of its contacts, has a gold ball and a strand of gold wire positioned substantially perpendicularly to the face of the chip bearing the contacts. The chip thus prepared is designed to be mounted on a receiver substrate provided with through-plated holes positioned so that each of them receives one of the gold wire strands that comes into contact with the walls of the through-plated hole into which it is introduced. With a chip prepared in this way, it is very difficult to make the mounting on the receiver substrate since the gold wire strands tend not to remain truly perpendicular to the face bearing the contacts and since it then becomes impossible to introduce them simultaneously into the holes of the substrate receiver.

SUMMARY OF THE INVENTION

The present invention is aimed at preventing these drawbacks, or at least at reducing them.

This is obtained by preparing the chip differently in such a way that the gold strands no longer constitute a handicap during the mounting of the chip but act as reference points to position the chip when it is mounted on a receiver substrate.

According to the present invention, there is provided a method to enable a flip-chip type mounting of a chip, having a face provided with contacts, on a face of a receiver substrate, this type of mounting being the one in which the face provided with contacts is facing the face of the receiver substrate, this method consisting, first of all, in carrying out a soldering, on each contact of the chip, of a gold ball obtained by the melting of the end of a gold wire, the soldering being done by pressing the gold ball to the contact considered, and then in positioning the chip on an intermediate substrate, called a tool substrate, in carrying out, imperfectly, a soldering between a predetermined point of the tool substrate and a part of the gold wire located at a certain distance from the ball considered, in prompting a break of the gold wire so as to keep only one segment of the gold wire, this segment being limited to the gold ball and the imperfect soldering, and in separating the chip from the tool substrate by detaching the imperfectly done solderings.

BRIEF DESCRIPTION OF THE DRAWING

The present invention will be understood more clearly and other features will appear from the following description and from the appended drawing, wherein:

FIGS. 1 to 6 shows steps in the preparation of a chip with a view to its mounting on a substrate;

FIGS. 7 to 9 show steps in the mounting, on a receiver substrate, of a chip prepared according to the preparation steps illustrated in FIGS. 1 to 6;

MORE DETAILED DESCRIPTION

In the different figures, the corresponding elements are designated by the same references; furthermore, in certain figures, in order to obtain improved visibility and, hence, improved understanding, the dimensions have not been drawn to scale.

FIG. 1 is a partial drawing, in a sectional view, of a machine to carry out ball-bonding operations. This figure shows a feed-through sleeve C and an electrode E. The feed-through sleeve is also called a capillary because it is drilled with a very thin hole used to lead through the end of a gold wire, A, to the vicinity of the electrode E. This gold wire A which, in the example described, has a diameter of 25 microns, comes from a coil and is connected to one of the terminals of a current generator (not shown), the other terminal of which is connected to the electrode E to produce an electrical arc between the end of the gold wire and the electrode. There exist other ball-bonding machines in which the device to produce an electrical arc is replaced by a torch. The head of the torch is positioned at the location of the electrode E, and its flame is directed to the end of the wire A.

The electrical arc makes the end of the wire A melt. This produces a ball B as shown in FIG. 2. In the example described, this ball has a diameter of about 50 microns.

The ball B is then soldered to one of the contacts of a chip 1, as shown in the sectional view of FIG. 3. To this end, the chip 1 is placed beforehand on an intermediate substrate S, also called a tool substrate, and the intermediate substrate is placed on a heating plate which is not shown in FIG. 3 but will appear in FIG. 5; the feed-through sleeve C is lowered, in the direction of the arrow F1, to press the ball B at the chosen position of the chip 1. During the soldering operations, an ultrasonic source with an adjustable level (not shown) is connected to the feed-through sleeve C to facilitate the soldering operations.

FIG. 4 shows that, in the rest of the operations, a part of the gold wire A, fixedly joined to the ball B, is extracted from the feed-through sleeve C and that the feed-through sleeve is lowered, in the direction of the arrow F2, to crush the wire A on the intermediate substrate, S, in order to fix it by soldering to the gold film that the substrate S has on its face in contact with the chip 1. After this operation of soldering with crushing, the feed-through sleeve is lifted at the same time as a clamp J, which is fixedly joined to the feed-through sleeve and has been shown only in FIG. 4, closes thereby blocking the wire. This results in a breaking of the gold wire at the point of exit from the feed-through sleeve C. It must be noted that this soldering is deliberately done in an imperfect way by the adjusting of the crushing pressure, and of the level and duration of the ultrasound so that, subsequently, it can be easily detached.

FIG. 5 shows the bond made between the ball B and a wire segment D between the chip 1 and the intermediate substrate S; this is the bond obtained according to the method described by means of FIGS. 1 to 4. FIG. 4 is a sectional view that shows how the chip 1 and the intermediate substrate S are positioned on a heating plate T carried to 110° C. to carry out operations described by means of FIGS. 3 and 4; the heating plate T and the intermediate substrate S are each drilled with a hole and the two holes are placed one on top of the other; the chip 1 is positioned on the intermediate substrate S, above the two holes; a suction pump, P, located beneath the plate S and creating a depression indicated by an arrow V, keeps the chip-substrate assembly in position on the heating plate.

After the bonds pertaining to each of the contacts of the chip 1 have been made, the chip is separated from its intermediate substrate and takes the form indicated FIG. 6 which shows six ball/wire-segment assemblies such as the assembly Bi-Di. This separation is made possible by the imperfect soldering done during the step of the method described by means of FIG. 4. It must be noted that the wire segments such as Di are positioned perpendicularly to the closest edge of the contact to which the ball with which they are fixedly joined is soldered.

Inasmuch as the method is designed to enable a flip-chip type mounting, it may end with the obtaining of the chip according to FIG. 6. Indeed, a chip of this kind is marketed as such to enable flip-chip type mountings: by means of the wire segments such as Di, it will enable the chip to be easily positioned on the receiver substrate and by means of the balls such as Bi it will enable proper bonding by soldering between the ports of the chip and the facing points of the receiver substrate.

The method can also be continued as prescribed here below and as illustrated by FIGS. 7, 8 and 9, in order to carry out a flip-chip type mounting up to its final stage.

By screen printing with a stencil, M, carried out by photo-etching, a solder paste is deposited at those positions of a receiver substrate that are designed to be in contact with the gold balls, Bi, of the chip 1. The stencil M is shown without its frame in FIG. 7. It enables the deposition of the solder paste at the desired places of the receiver substrate and drilled, for this purpose, with holes such as Q1, obtained during the photo-etching process.

FIG. 8 shows a part of a receiver substrate 2, designed to receive the chip 1 according to FIG. 6 and comprising, to this end, conductive tracks such Hi. The substrate 2 is shown after small deposits of solder paste, such as Gi, have been obtained at different places of its surface by means of the stencil according to FIG. 7. In FIG. 8, these deposits are represented by small hatched surfaces. In the example described, the solder paste is mixture of 88% of metal and 12% of binder and resin with the metal part comprising 88% of indium, 15% of lead and 5% of silver.

FIG. 9 shows the chip 1 of FIG. 6 laid on the receiver substrate of FIG. 8, itself placed on a heating plate, T, represented by a contour shown in broken lines that demarcates only one part of the heating plate; this plate is taken to 170° C. As can be seen in this figure, the wire segments such as Di constitute good reference points for the positioning of the chip 1 on its receiver substrate 2. The heating plate 2 is used to produce a melting of the solder paste and thus to give solders at the positions of the solder paste deposits, i.e. at the places where the balls, such as Bi, of the chip 1 and the conductive tracks of the receiver substrate 2 are in contact. The mounting thus obtained is, as desired, covered with a protective resin or protected by a sealed, insulator hood.

The present invention is not limited to the example described. It is thus, in particular, that the intermediate substrate is not indispensable, it being possible for the chip according to FIG. 6 to be prepared by a soldering of balls, such as Bi, to which there are left attached wire segments, such as Di, obtained simply by cutting the gold wire coming from the feed-through sleeve of the machine to the desired length, carrying out the ball-bonding and folding this wire segment to bring it to a predetermined position.

Similarly, the mounting method can be implemented by soldering only a ball per port of the chip, i.e. without any wire segment but, in this case, it is more difficult to position the chip during the final stage of the flip-chip mounting operation, and a machine to position this chip becomes obligatory.

What is claimed is:

1. A method of flip-chip mounting a semiconductor chip having contacts on a face thereof onto a surface of a receiver substrate which faces said contacts, said method comprising the steps of:
    (a) soldering, on each of said contacts, gold balls obtained by melting a gold wire, by pressing said gold balls against each of said contacts;
    (b) positioning said semiconductor chip on an intermediate tool substrate;
    (c) soldering a point on said gold wire at a distance from each of said gold balls to points on said tool substrate;
    (d) breaking off said gold wire beyond said points at which it is soldered to said tool substrate; and
    (e) separating said semiconductor chip from said tool substrate by detaching the solderings carried out in step (c).

2. The method according to claim 1, wherein said step (b) comprises:
    drilling a hole through said tool substrate; and
    positioning said semiconductor chip on said tool substrate by placing a heating plate provided with a suction device directly beneath said hole through said tool substrate and placing said semiconductor chip directly above said hole through said tool substrate.

3. The method according to any of claims 1 or 2, wherein:
    a solder paste is deposited on said receiver substrate at conductive zones thereof which are positioned to contact said contacts of said semiconductor chip;
    said semiconductor chip is positioned on said receiver substrate such that said gold balls contact said solder paste at said conductive zones; and
    said solder paste is melted to solder said semiconductor chip to said receiver substrate.

* * * * *